(12) United States Patent  
Park et al.

(10) Patent No.: US 9,412,610 B2  
(45) Date of Patent: Aug. 9, 2016

(54) SEMICONDUCTOR DEVICES AND METHODS OF MANUFACTURING THE SAME

(71) Applicant: Samsung Electronics Co., Ltd., Suwon-si, Gyeonggi-do (KR)

(72) Inventors: Seung-Hoon Park, Daejeon (KR); Deog-Ja Koo, Yongin-si (KR); Gyung-Jin Min, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/637,420

(22) Filed: Mar. 4, 2015

(65) Prior Publication Data

US 2015/0255301 A1 Sep. 10, 2015

(30) Foreign Application Priority Data

Mar. 7, 2014 (KR) .................. 10-2014-0026924

(51) Int. Cl.
*H01L 21/3065* (2006.01)
*H01L 21/768* (2006.01)
*H01L 23/48* (2006.01)

(52) U.S. Cl.
CPC .... *H01L 21/30655* (2013.01); *H01L 21/76871* (2013.01); *H01L 21/76879* (2013.01); *H01L 21/76898* (2013.01); *H01L 23/481* (2013.01); *H01L 2224/16145* (2013.01)

(58) Field of Classification Search
CPC .................. H01L 21/30655; H01L 21/76879; H01L 21/76898; H01L 23/481; H01L 2224/16145
USPC ........................................................ 438/667
See application file for complete search history.

(56) References Cited

U.S. PATENT DOCUMENTS

| 8,049,327 | B2 | 11/2011 | Kuo et al. |
| 8,415,804 | B2 | 4/2013 | Lee et al. |
| 2006/0202348 | A1* | 9/2006 | Kameyama ....... H01L 21/76898 257/774 |
| 2011/0254165 | A1 | 10/2011 | Muranaka |
| 2012/0309194 | A1 | 12/2012 | Xu et al. |

(Continued)

FOREIGN PATENT DOCUMENTS

| JP | 2012-146754 | 8/2012 |
| KR | 1020120054994 A | 5/2012 |

(Continued)

*Primary Examiner* — Fernando L Toledo
*Assistant Examiner* — Adam S Bowen
(74) *Attorney, Agent, or Firm* — Myers Bigel & Sibley, P.A.

(57) ABSTRACT

A method of manufacturing a semiconductor device is disclosed. In the method, a substrate having a first surface and a second surface is provided. The second surface is opposed to the first surface. A via hole is formed to penetrate the substrate from the first surface toward the second surface. The via hole includes a first portion and a second portion. The first portion has a first sidewall which is substantially perpendicular to the first surface. The second portion has a second sidewall which gradually decreases from the first surface toward the second surface, and has a bottom surface that substantially flat. A seed pattern is formed on the first sidewall of the first portion, the second sidewall of the second portion and the bottom surface of the second portion of the via hole. A first thickness (Vt) of the seed pattern on the first sidewall of the first portion is less than a second thickness (Vlt) of the seed pattern on the second sidewall of the second portion. A through via is formed to fill the via hole.

18 Claims, 12 Drawing Sheets

(56) References Cited

U.S. PATENT DOCUMENTS

| | | |
|---|---|---|
| 2013/0020719 A1 | 1/2013 | Jung et al. |
| 2013/0052830 A1 | 2/2013 | Kim et al. |
| 2013/0099368 A1 | 4/2013 | Han |
| 2014/0061915 A1* | 3/2014 | Collins ................ H01L 23/481 257/751 |
| 2014/0312468 A1* | 10/2014 | Chen ................ H01L 21/76898 257/621 |

FOREIGN PATENT DOCUMENTS

| | | |
|---|---|---|
| KR | 1020130005254 A | 1/2013 |
| KR | 1020130042936 A | 4/2013 |

* cited by examiner

SEMICONDUCTOR DEVICES AND METHODS OF MANUFACTURING THE SAME

CROSS-REFERENCE TO RELATED APPLICATION

This application claims under 35 U.S.C §119 to Korean Patent Application No. 10-2014-0026924 filed on Mar. 7, 2014 in the Korean Intellectual Property Office, the disclosure of which is incorporated by reference herein in its entirety.

BACKGROUND

Recently, as semiconductor devices are more highly integrated, a three dimensional package technology has been studied. Particularly, a through silicon via (TSV) technology have been widely studied. In the TSV technology, a via hole is formed through a silicon substrate, and a through via is formed to fill the via hole. Further, a seed pattern may be formed on an inner wall of the via hole.

However, as an aspect ratio of the via hole increases, it is hard to form the seed pattern that includes good step coverage.

SUMMARY

Example embodiments of the present inventive concepts provide semiconductor devices having an improved reliability.

Example embodiments of the present inventive concepts provide methods of manufacturing the semiconductor device having an improved reliability.

According to an aspect of the present inventive concepts, there are provided methods of manufacturing a semiconductor device. In the methods, a substrate having a first surface and a second surface is provided. The second surface is opposed to the first surface. A via hole is formed to penetrate the substrate from the first surface toward the second surface. The via hole includes a first portion and a second portion. The first portion has a first sidewall that is substantially perpendicular to the first surface. The second portion has a second sidewall that gradually decreases from the first surface toward the second surface, and has a bottom surface that is substantially flat. A seed pattern is formed on the first sidewall of the first portion, the second sidewall of the second portion and the bottom surface of the second portion of the via hole. A first thickness (Vt) of the seed pattern on the first sidewall of the first portion is less than a second thickness (VIt) of the seed pattern on the second sidewall of the second portion. A through via is formed to fill the via hole.

In some embodiments, the first portion of the via hole may have a first width (W1), the second portion of the via hole may have a second width (W2), and a ratio between the second width and the first width (W2/W1) may be between about 0.85 and about 0.94.

In some embodiments, forming the via hole may include a Bosch process in which a cycle including an etching operation and an operation for forming a passivation layer on an inner wall of the via hole may be performed repeatedly.

In some embodiments, a first etching process time for forming the first portion of the via hole may be substantially greater than a second etching process time for forming the second portion of the via hole.

In some embodiments, etching process time of each cycle of the Bosch process may be determined by equations (1) and (2)

$$Y = Y_o + [Y_E - Y_o]x^n \quad (1)$$

$$x = (c_R - 1)/(c_E - 1) \quad (2).$$

Some embodiments provide that Y represents etching process time of each cycle of the Bosch process, $Y_o$ represents etching process time of a first cycle of the Bosch process, $Y_E$ represents etching process time of a last cycle of the Bosch process. $C_R$ represents a current cycle number, and $C_E$ represents a total cycle number. n is a variable parameter.

In some embodiments, n of the equation (1) may decrease, as a width of the via hole may increase.

In some embodiments, a height difference between an uppermost and a lowermost of the bottom surface of the via hole may be a first distance (D3), and a ratio between the first distance and the first width (D3/W1) may be between about 0 and about 0.15.

In some embodiments, a ratio between the first thickness and the second thickness (Vt/VIt) may be between about 1.2 and about 2.

In some embodiments, the bottom surface of the second portion of the via hole may include a peripheral portion adjacent the second sidewall of the second portion and a central portion surrounded by the peripheral portion. The central portion may be more flat than the peripheral portion.

In some embodiments, a third thickness (It) of the seed pattern on the central portion of the bottom surface of the second portion may be greater than a fourth thickness (IIt) of the seed pattern on the peripheral portion of the bottom surface of the second portion.

In some embodiments, the fourth thickness (IIt) of the seed pattern on the peripheral portion of the bottom surface of the second portion may be less than the second thickness (VIt) of the seed pattern on the second sidewall of the second portion.

In some embodiments, the through via may include a first protrusion portion and a second protrusion portion, the first protrusion portion may be exposed to the first surface of the substrate, and the second protrusion portion may be exposed to the second surface of the substrate.

In some embodiments, the second protrusion portion may be formed by partially removing the substrate from the second surface of the substrate.

In some embodiments, the sidewall of the first portion of the via hole may be a scallop shape.

According to an aspect of the present inventive concepts, there are provided methods of manufacturing a semiconductor device. In the methods, a substrate having a first surface and a second surface is provided. The second surface may be opposed to the first surface. A via hole is formed by a Bosch process in which a cycle including an etching step and a step for forming a passivation layer on an inner wall of the via hole is performed repeatedly. The via hole penetrates the substrate from the first surface toward the second surface, and includes a first portion and a second portion. The first portion has a first sidewall which is substantially vertical to the first surface. The second portion has a second sidewall which gradually decreases in thickness toward the second surface, and has a bottom surface that is substantially flat. The first portion of the via hole has a first width (W1), the second portion of the via hole has a second width (W2), and a ratio between the second width and the first width (W2/W1) is between about 0.85 and about 0.94. A seed pattern is formed on the first sidewall of the first portion, the second sidewall of the second portion and the bottom surface of the second portion of the via hole. A first thickness (Vt) of the seed pattern on the first sidewall of the first portion of the via hole is less than a second thickness (VIt) of the seed pattern on the second sidewall of the second portion of the via hole. A through via is formed to fill the via hole.

As described above, the semiconductor device may be manufactured to include a through via filling a via hole. The via hole may include a first portion and a second portion which is fluid communicated with the first portion. A sidewall of the second portion may have a taper shape, and a bottom surface of the second portion may be substantially flat, so that a seed pattern on an inner wall of the via hole may have an improved coverage.

Some embodiments include methods of manufacturing a semiconductor device. Such methods may include providing a substrate including a first surface and a second surface that is opposed to the first surface, and forming a via hole by a Bosch process in which a cycle including an etching operation and a operation for forming a passivation layer on an inner wall of the via hole is performed repeatedly, the via hole penetrating the substrate from the first surface toward the second surface, the via hole including a first portion and a second portion, wherein the first portion includes a first sidewall that is substantially perpendicular to the first surface, wherein the second portion includes a second sidewall that defines a taper of the via hole and includes an angle relative to the first sidewall that is less than or equal to about 10 degrees, and a bottom surface that is substantially flat. Methods may further include forming a seed pattern on the first sidewall of the first portion, the second sidewall of the second portion and the bottom surface of the second portion of the via hole, wherein a first thickness (Vt) of the seed pattern on the first sidewall of the first portion is less than a second thickness (VIt) of the seed pattern on the second sidewall of the second portion and forming a through via that fills the via hole.

In some embodiments, the first portion of the via hole includes a first width (W1), the second portion of the via hole includes a second width (W2), and a ratio between the second width and the first width (W2/W1) is between about 0.85 and about 0.94.

Some embodiments provide that a first etching process time for forming the first portion of the via hole is substantially greater than a second etching process time for forming the second portion of the via hole, and an etching process time of each cycle of the Bosch process is determined by equations (1) and (2), as follows:

$$Y = Y_o + [Y_E - Y_o] x^n \quad (1), \text{ and}$$

$$x = (c_R - 1)/(c_E - 1) \quad (2).$$

Some embodiments provide that Y represents etching process time of each cycle of the Bosch process, $Y_0$ represents etching process time of a first cycle of the Bosch process, $Y_E$ represents etching process time of a last cycle of the Bosch process, $C_R$ represents a current cycle number, $C_E$ represents a total cycle number and n is a variable parameter. In some embodiments, n of the equation (1) decreases, as a width of the via hole increases.

In some embodiments, the bottom surface of the second portion of the via hole includes a peripheral portion adjacent the second sidewall of the second portion and a central portion surrounded by the peripheral portion, the central portion is more flat than the peripheral portion, a third thickness (It) of the seed pattern on the central portion of the bottom surface of the second portion is greater than a fourth thickness (IIt) of the seed pattern on the peripheral portion of the bottom surface of the second portion, and the fourth thickness (IIt) of the seed pattern on the peripheral portion of the bottom surface of the second portion is less than the second thickness (VIt) of the seed pattern on the second sidewall of the second portion.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor device in accordance with some embodiments of the present inventive concept;

FIG. 2 is a schematic view illustrating a via hole of FIG. 1;

FIG. 3 is a schematic view illustrating a seed pattern formed on an inner wall of a via hole in accordance with some embodiments of the present inventive concept;

FIG. 4 is a cross-sectional view illustrating a semiconductor device in accordance with some embodiments of the present inventive concept;

FIG. 5 is a cross-sectional view illustrating a semiconductor device in accordance with some embodiments of the present inventive concept;

FIG. 6 is a cross-sectional view illustrating a semiconductor device in accordance with some embodiments of the present inventive concept;

FIG. 7 is a cross-sectional view illustrating a semiconductor device in accordance with some embodiments of the present inventive concept;

FIG. 8 is a cross-sectional view illustrating a stacking structure of a semiconductor device in accordance with some embodiments of the present inventive concept;

FIGS. 9 to 15 are cross-sectional views and a graph illustrating methods of manufacturing a semiconductor device in accordance with some embodiments of the present inventive concept;

FIG. 16 is a cross-sectional view illustrating methods of manufacturing a stacking structure of a semiconductor device in accordance with some embodiments of the present inventive concept;

FIG. 17 is a schematic diagram illustrating a memory system in accordance with some embodiments of the present inventive concept; and FIG. 18 is a schematic diagram illustrating an electronic system in accordance with some embodiments of the present inventive concept.

DETAILED DESCRIPTION

Figure 1:
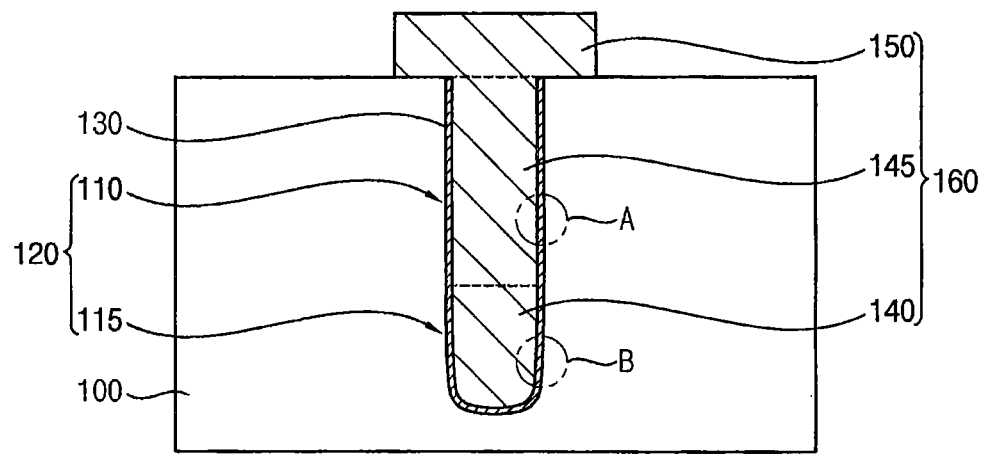
FIGS. 1 to 18 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the figures cited in this specification, a direction substantially vertical to a top surface of a channel layer is referred to as a first direction, and two directions substantially parallel to the top surface of the channel layer and substantially perpendicular to each other are referred to as a second direction and a third direction. Additionally, a direction indicated by an arrow in the figures and a reverse direction thereto are considered to be the same direction.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of devices may be arranged in an array and/or in a two-dimensional pattern.

Figure 1A:
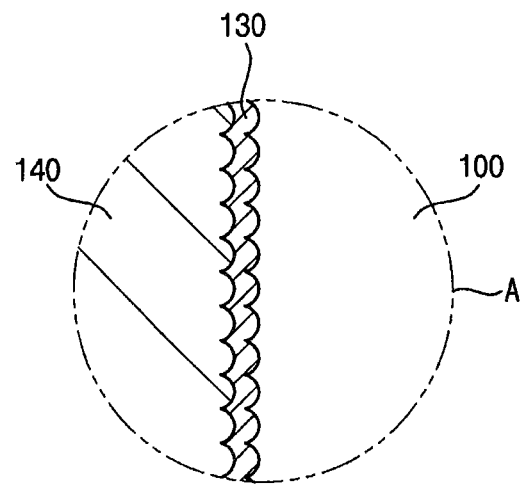
FIGS. 1A and 1B are enlarged cross-sectional views illustrating region A and B of FIG. 1.
Figure 1B:
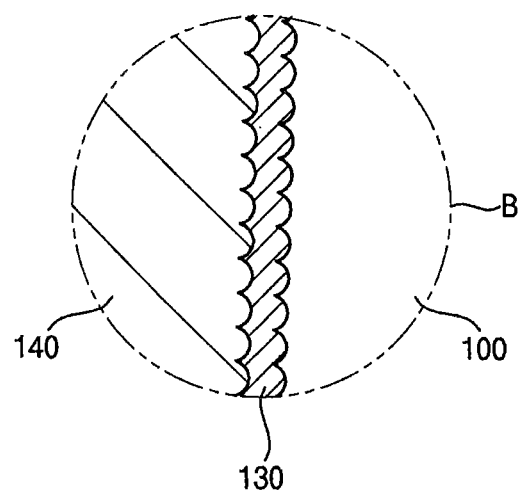
Figure 2:
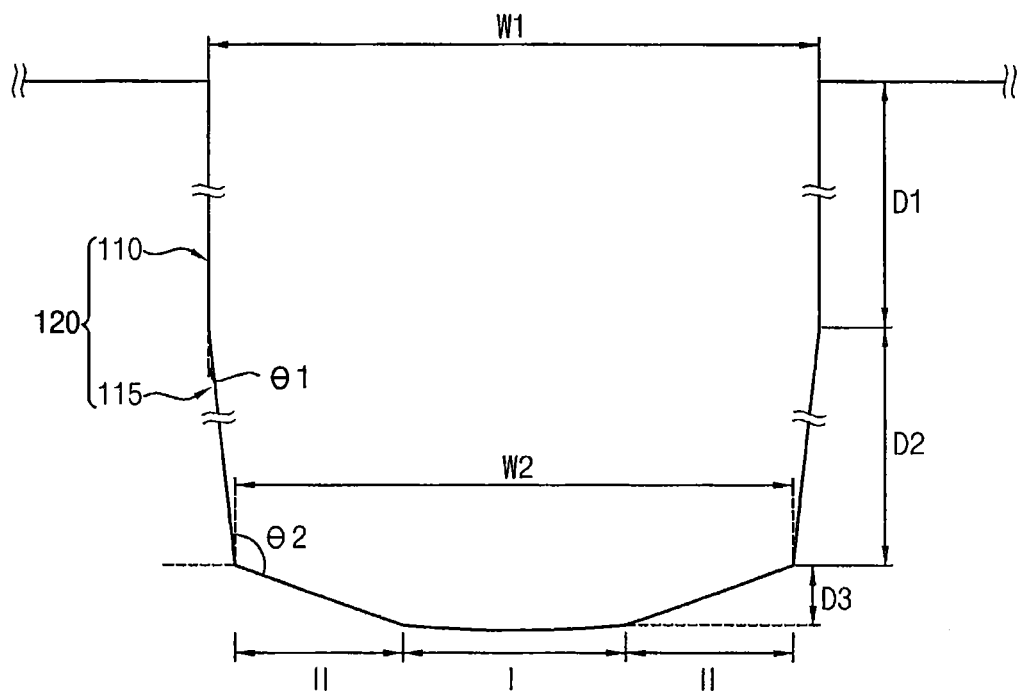
Figure 3:
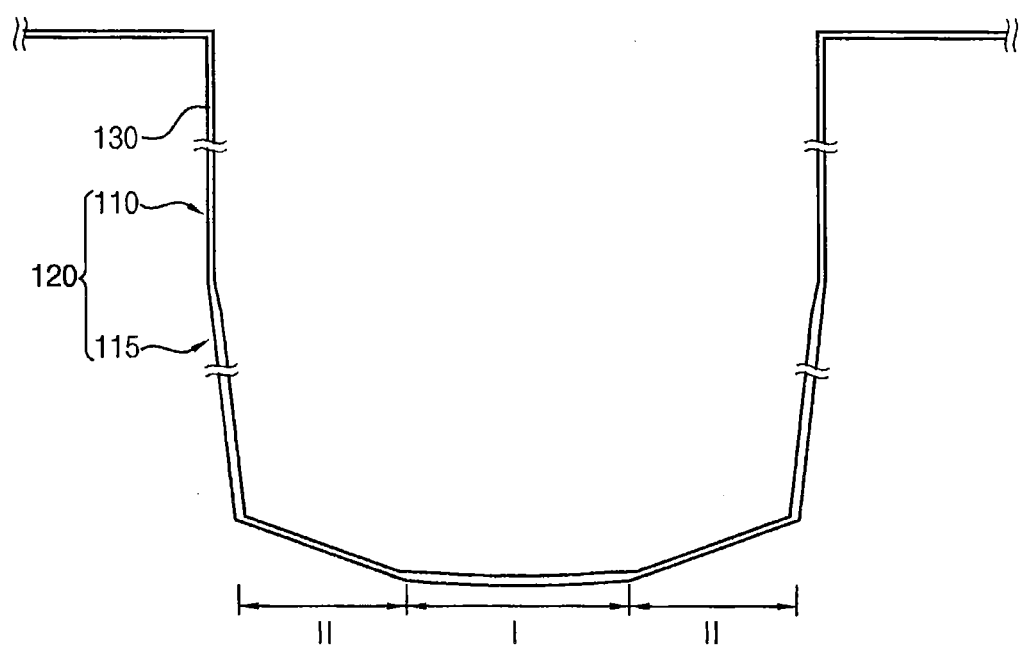

FIG. 1 is a cross-sectional view illustrating a semiconductor device in accordance with some embodiments of the present inventive concept. FIGS. 1A and 1B are enlarged cross-sectional views illustrating region A and B of FIG. 1, and FIG. 2 is a schematic view illustrating a via hole of FIG. 1. Further, FIG. 3 is a schematic view illustrating seed patterns formed on an inner wall of a via hole in accordance with some embodiments of the present inventive concept.

Referring to FIG. 1, the semiconductor device may include a substrate 100, a via hole 120 extending into the substrate 100, a seed pattern 130 and a through via 160 filling the via hole 120.

The substrate 100 may include a semiconductor substrate. For example, the substrate 100 may include a silicon substrate, a germanium substrate, a silicon-germanium substrate, a silicon-on-insulator (SOI) substrate, a germanium-on-insulator (GOI) substrate, etc.

The substrate 100 may have a first surface and a second surface, and the first surface may be opposed to the second surface. For example, the first surface may be a top surface, and the second surface may be a bottom surface. In some embodiments, an integrated circuit may be disposed on the first surface of the substrate 100, or may be embedded in an upper portion of the substrate 100 adjacent the first surface. That is, the first surface of the substrate may be an active surface on which the integrated circuit may be disposed. The integrated circuit may include variable circuit and/or element depending on the semiconductor device. For example, the integrated circuit may include a memory circuit, a logic circuit, or a combination thereof.

The via hole 120 may extend from the first surface of the substrate 100 toward the second surface. Referring to FIGS. 1 and 2, the via hole 120 may include a first portion 110 and a second portion 115, which may be in fluid communication with each other. In some embodiments, the first portion 110 may be disposed adjacent the first surface of the substrate 100, and the second portion 115 may be disposed adjacent the second surface of the substrate 100.

In some embodiments, the first portion 110 may have a first width W1 which may be substantially constant. That is, a first sidewall of the first portion 110 may be substantially perpendicular to the first surface of the substrate 100. Further, the second portion 115 may have a second width W2 that may gradually decrease from the first surface toward the second surface. That is, a second sidewall of the second portion of the second portion 115 may have a taper shape.

Referring to FIG. 2, a first angle θ1 may be defined by the first sidewall of the first portion 110 and the second sidewall of the second portion 115. For example, the first angle θ1 may be less than about 10°. Further, a ratio (W2/W1) between the second width W2 of the second portion 115 and the first width W1 of the first portion 110 may be between about 0.85 and about 0.94. If the ratio (W2/W1) is greater than about 0.94, the second portion may not have the taper shape. If the ratio (W2/W1) is less than about 0.85, the second width W2 at a bottom of the second portion may be too small to receive a through via.

Further, the first portion 110 may have a first depth D1, and the second portion 115 may have a second depth D2. That is, the first depth D1 may be defined from the first surface of the substrate 100 to a point where the first portion and the second portion are connected. The second depth D2 may be defined from the point to a bottom surface of the second surface. In some embodiments, the first depth D1 may be twice greater than the second depth D2.

Referring to FIGS. 1A and 1B, the first sidewall of the first portion 110 and the second sidewall of the second portion 115 may have a scallop shape. Etching steps may be repeatedly performed during the process for forming the first portion 110 and the second portion 115 of the via hole 120, so that scallop shape are formed on the sidewalls of the first portion 110 and the second portion 115. In some embodiments, a size of single scallop shape may be greater than about 20 nm.

The via hole 120 may have the bottom surface that may be substantially flat. In this case, a height difference D3 between an uppermost and a lowermost of the bottom surface of the via hole 120 may be less than a predetermined value. Further, a ratio (D3/W1) between the height difference and the first width may be less than a predetermined value. For example, when the first width W1 of the via hole 120 is between about 4 μm and about 10 μm, the height difference may be less than about 1 μm. Hereinafter, when a ratio (D3/W1) between the height difference and the first width is less than about 0.15, the bottom surface may be defined to be substantially flat.

In some embodiments, the bottom surface of the via hole 120 may include a central portion (I) and a peripheral portion (II). For example, the central portion may be more flat than the peripheral portion. The bottom surface may be getting deeper from a peripheral portion (II) to a central portion (I). Therefore, the uppermost point may be disposed adjacent the second sidewall of the second portion 115, and the lowermost point may be disposed at a center of the bottom surface.

Further, a second angle θ2 may be defined by the bottom surface of the second portion 115 and the sidewall of the second portion 116. In some embodiments, the second angle θ2 may be between about 90° and about 140°. When the second angle θ2 is less than about 90°, the central portion (I) may be higher than the peripheral portion (II). When the second angle θ2 is greater than about 140°, a ratio (D3/W1) between the height difference and the first width may be greater than about 0.15.

Referring to FIG. 3, the seed pattern 130 may be disposed on the first sidewall of the first portion 110, the second sidewall and the bottom surface of the second portion 115.

The seed pattern 130 may serve as a seed during a process for forming the through via. For example, the seed pattern 130 may include a metal such as aluminum (Al), copper (Cu), Nickel (Ni), Tungsten (W), Titanium (Ti), Tantalum (Ta), gold (Au), etc.

The seed pattern 130 may have an improved coverage on the sidewall and a bottom surface of the via hole 120. For example, a ratio between a maximum thickness and a minimum thickness of the seed pattern 130 may be less than a predetermined value.

Figure 13:
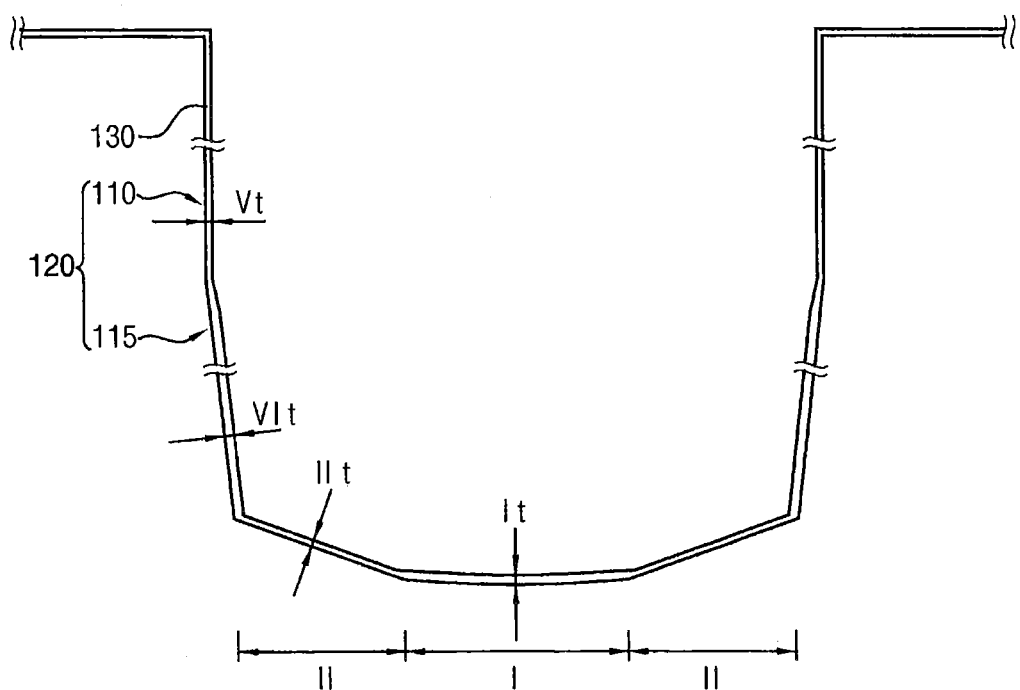

Brief reference is now made to FIG. 13, which illustrates the thicknesses discussed in this paragraph. The seed pattern 130 may have a first thickness (It) on the central portion (I) of the bottom surface, and may have a second thickness (IIt) on the peripheral portion (II) of the bottom surface. Further, the seed pattern 130 may have a third thickness (Vt) on the first sidewall of the first portion 110, and may have a fourth thickness (VIt) on the second sidewall of the second portion 115. In some embodiments, the first thickness (It) and the fourth thickness (VIt) may be substantially greater than the second thickness (IIt) and the third thickness (Vt). For example, a ratio between the third thickness and the fourth thickness (Vt/VIt) is between about 1.2 and about 2. For example, the second thickness (IIt) may be substantially identical to the fourth thickness (VIt) of the second portion 115.

In some embodiments, a barrier pattern including a metal nitride may be further formed on and/or under the seed pattern.

The through via 160 may be formed on the first surface of the substrate 100 to fill the via hole 120. That is, the through via 160 may extend from the first surface of the substrate 100 toward the second surface. The through via 160 may be electrically connected to the integrated circuit, and may serve to connect the semiconductor device to other semiconductor device or a module substrate.

In some embodiments, the through via 160 may include a first filling portion 140, a second filling portion 145 and a first protrusion portion 150. That is, the first filling portion 140 may fill the second portion 115 of the via hole 120, and the second filling portion 145 may fill the first portion 110 of the via hole 120. Further, the first protrusion portion 150 may be connected to the second filling portion 145, and may be disposed on the first surface of the substrate 100.

The first and second filling portions 140 and 145 may fill the via hole 120, so that the first and second filling portions 140 and 145 may have a shape corresponding to the shape of via hole 120. That is, the first filling portion 140 may have a taper shape, in which a width of the first filling portion 140 may gradually decrease, as the depth increases. The bottom surface of the first filling portion 140 may be substantially flat. While, the second filling portion 145 may be connected to the first filling portion 140, and may have a width that is substantially constant. As the seed pattern 130 has an improved stop coverage, the through via 160 may sufficiently fill the via hole 120 with forming a void. Therefore, the semiconductor device may have an improved reliability.

Figure 4:
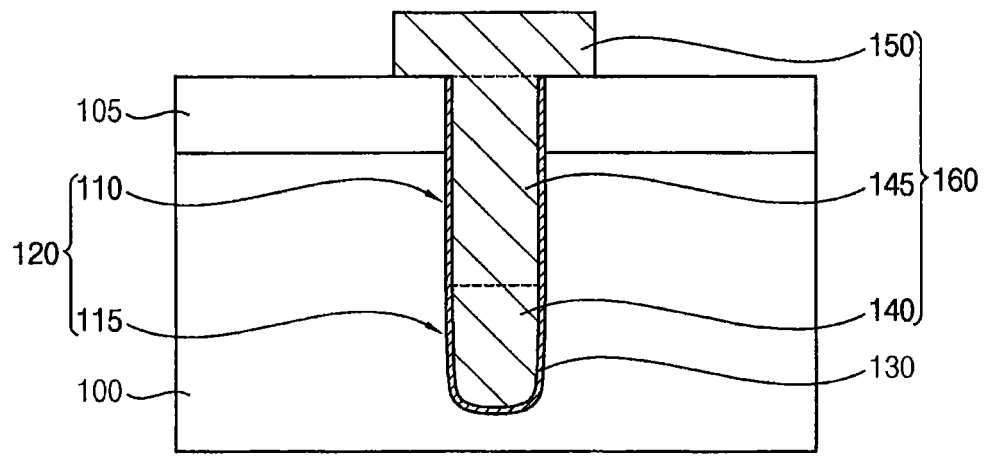

FIG. 4 is a cross-sectional view illustrating a semiconductor device in accordance with some embodiments of the present inventive concept. The semiconductor device of FIG. 4 may be substantially similar to the semiconductor device of FIG. 1 except for an insulation layer 105.

Referring to FIG. 4, the semiconductor device may include a substrate 100, a via hole 120 extending into the substrate 100, a seed pattern 130 and a through via 160 filling the via hole 120.

In some embodiments, an integrated circuit may be disposed on a first surface of the substrate 100, or may be embedded in an upper portion of the substrate 100 adjacent the first surface.

An insulation layer 105 may be disposed on the first surface of the substrate 100. The insulation layer 105 may include passivation layer to protect the integrated circuit and/or insulating interlayer disposed between wiring layers.

The via hole 120 may include the first portion 110 and the second portion 115. In some embodiments, the via hole 120 may be substantially identical to those described with reference to FIGS. 1A, 1B and 2. That is, a second sidewall of the second portion 115 of the via hole 120 may have a taper shape, and a bottom surface of the second portion 115 may be substantially flat. Further, the first portion 110 of the via hole 120 may be formed through the insulation layer 105.

The seed pattern 130 may be substantially identical to those described with reference to FIG. 3. The seed pattern 130 disposed on the sidewall and the bottom surface of the via hole 120 may have an improved step coverage.

The through via 160 may include a first filling portion 140, a second filling portion 145, and a first protrusion portion 150, and may fill the via hole 120.

Figure 5:
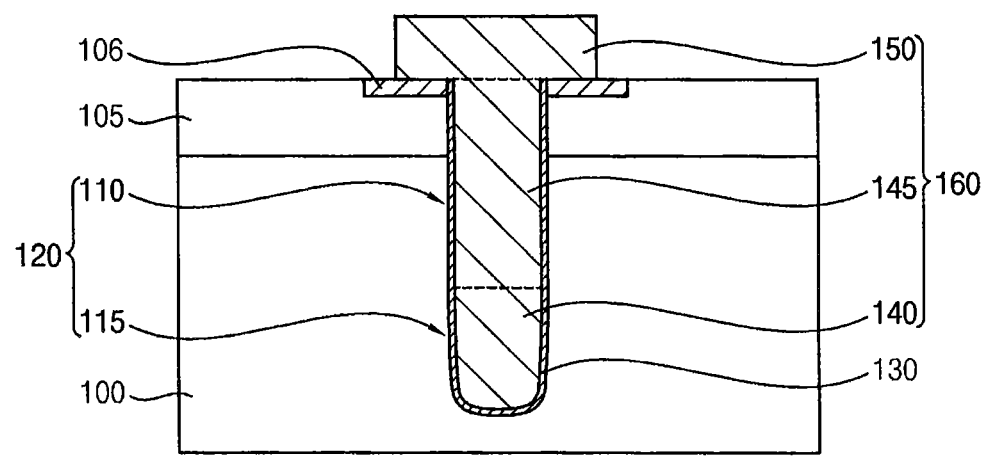

FIG. 5 is a cross-sectional view illustrating a semiconductor device in accordance with some embodiments of the present inventive concept. The semiconductor device of FIG. 5 may be substantially similar to the semiconductor device of FIG. 4 except for a pad 106.

Referring to FIG. 5, the semiconductor device may include a substrate 100, an insulation layer 105 and a pad 106 disposed on the substrate 100. The semiconductor device may further include a via hole 120 extending into the substrate 100, a seed pattern 130 and a through via 160 filling the via hole 120.

In some embodiments, an integrated circuit may be disposed on a first surface of the substrate 100, or may be embedded in an upper portion of the substrate 100 adjacent the first surface. The pad 106 may serve to electrically connect the through via 160 to the integrated circuit.

The via hole 120 may include the first portion 110 and the second portion 115. In some embodiments, the via hole 120 may be substantially identical to those described with reference to FIGS. 1A, 1B and 2. The seed pattern 130 may be substantially identical to those described with reference to FIG. 3. The seed pattern 130 disposed on the sidewall and the bottom surface of the via hole 120 may have an improved step coverage.

Figure 6:
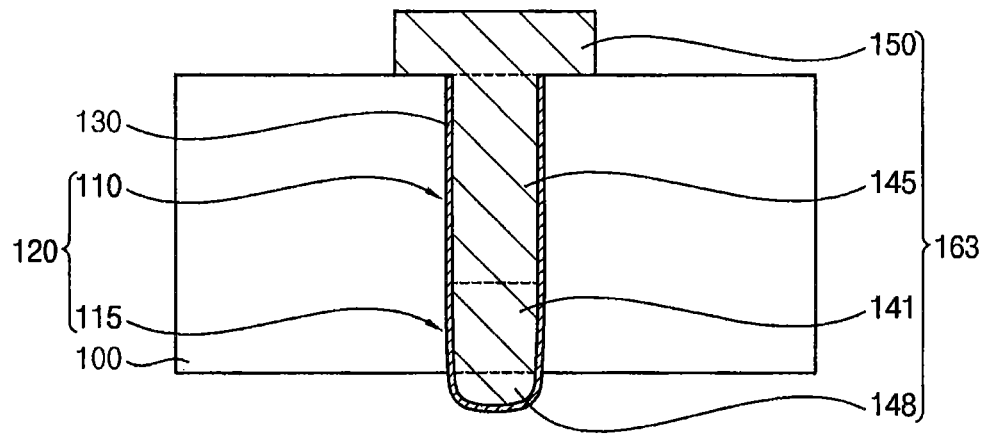

FIG. 6 is a cross-sectional view illustrating a semiconductor device in accordance with some embodiments of the present inventive concept. The semiconductor device of FIG. 6 may be substantially similar to the semiconductor device of FIG. 1 except for a second protrusion portion 148. In some embodiments, the semiconductor device of FIG. 6 may be substantially similar to the semiconductor devices of FIG. 4 or FIG. 5 except for a second protrusion portion 148.

Referring to FIG. 6, the semiconductor device may include a substrate 100, a via hole 120 extending into the substrate 100, a seed pattern 130 and a through via 163 filling the via hole 120.

In some embodiments, an integrated circuit may be disposed on a first surface of the substrate 100, or may be embedded in an upper portion of the substrate 100 adjacent the first surface.

The via hole 120 may include the first portion 110 and the second portion 115. In some embodiments, the via hole 120 may be substantially identical to those described with reference to FIGS. 1A, 1B and 2. That is, a second sidewall of the second portion 115 of the via hole 120 may have a taper shape, and a scallop shape may be formed on a first sidewall of the first portion 110 and the second sidewall of the second portion 115. Further, the via hole 120 may be formed through the substrate 100.

The seed pattern 130 may be substantially similar to those described with reference to FIG. 3. The seed pattern 130 disposed on the sidewall of the via hole 120 may have an improved step coverage.

Further, the through via 163 may include a first filling portion 141, a second filling portion 145, a first protrusion portion 150 and a second protrusion portion 148. That is, the first protrusion portion 150 may be exposed by a first surface of the substrate 100, and the second protrusion portion 148 may be exposed by a second surface of the substrate 100. The second protrusion portion 148 may be exposed by partially removing the substrate 100 from the second surface of the substrate 100. The seed pattern 130 disposed on the bottom surface of the via hole 120 may be remained as illustrate in FIG. 6. In some embodiments, the seed pattern 130 disposed on the bottom surface of the via hole 120 may be removed. The seed pattern 130 disposed on the sidewall of the via hole 120 may have an improved step coverage. That is, a ratio between the third thickness of the seed pattern 130 on the first sidewall and the fourth thickness of the seed pattern 130 on the second sidewall (Vt/VIt) is between about 1.2 and about 2.

Therefore, an electrical signal from the integrated circuit on the first surface may be transferred to the second surface of the substrate 100. That is, the through via 163 may transfer the electrical signal through the substrate 100.

Figure 7:
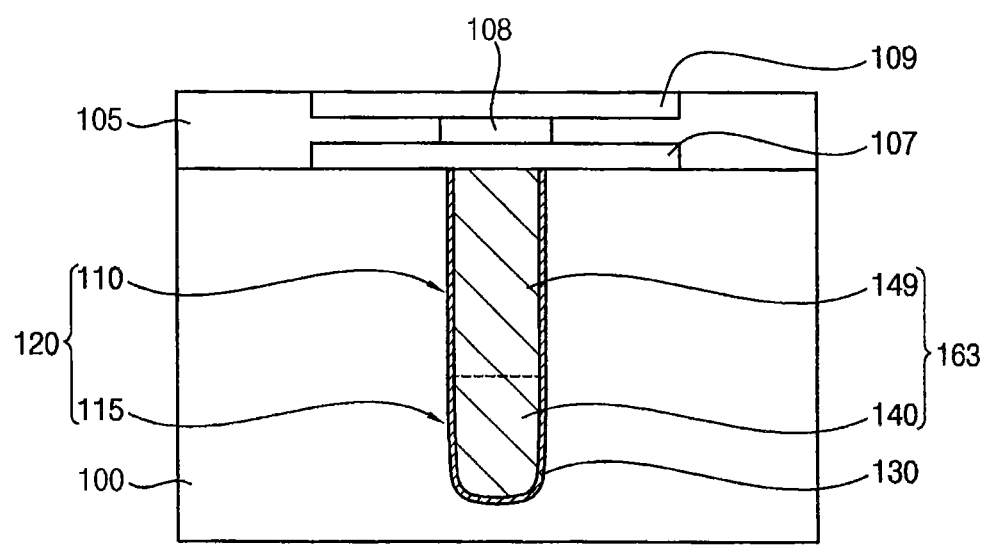

FIG. 7 is a cross-sectional view illustrating a semiconductor device in accordance with some embodiments of the present invention. The semiconductor device of FIG. 7 may be substantially similar to the semiconductor device of FIG. 1 except for a wiring pattern 107, a contact plug 108, and a pad 109.

Referring to FIG. 7, the semiconductor device may include a substrate 100, a via hole 120 extending into the substrate 100, a seed pattern 130 and a through via 163 filling the via hole 120. Further, the semiconductor device may be electrically connected to the pad 109 and the wiring pattern 107 by the contact plug 107.

The via hole 120 may be substantially identical to those described with reference to FIGS. 1A, 1B and 2. The through via 163 may include a first filling portion 140 and a second filling portion 149 filling the via hole 120. The seed pattern 130 disposed on the sidewall of the via hole 120 may have an improved step coverage.

On the other hand, the wiring pattern 107 may directly contact the through via 163. The wiring pattern 107 may be electrically connected to the pad 109 by the contact plug 108.

Figure 8:
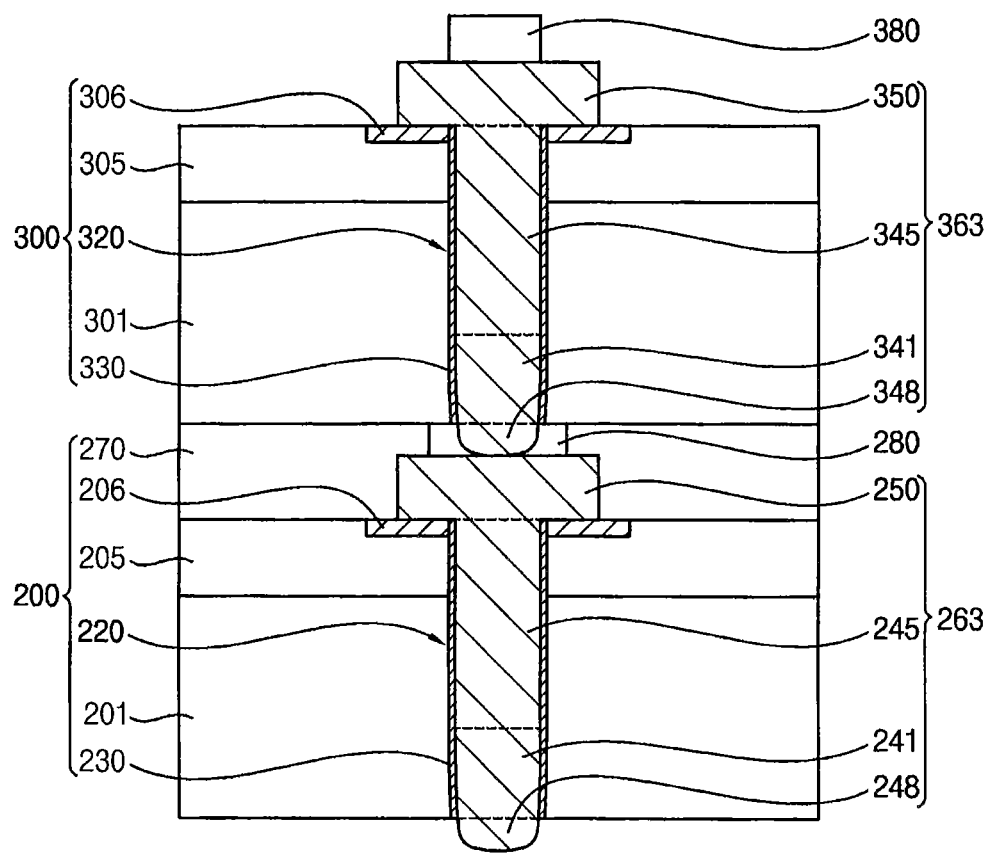

FIG. 8 is a cross-sectional view illustrating a stacking structure of a semiconductor device in accordance with some embodiments of the present inventive concept.

Referring to FIG. 8, the stacking structure of the semiconductor device may include a first semiconductor device 200 and a second semiconductor device 300.

Each of the first and second semiconductor devices 200 and 300 may include each of the substrates 201 and 301, each of the insulation layers 205 and 305 and each of the pads 206 and 306 on the substrates 201 and 301. Each of the first and second semiconductor devices 200 and 300 may further include each of the via holes 220 and 320, each of the seed patterns 230 and 330 and each of the through vias 263 and 363. Further, each of the through vias 263 and 363 may include each of the first protrusion portions 250 and 350, each of the first filling portions 241 and 341, each of the second filling portions 245 and 345 and each of the second protrusion portions 248 and 348.

The first and second semiconductor devices 200 and 300 may transfer the electrical signal through each of the substrates 201 and 301. That is, the first protrusion portion 250 of the first semiconductor device 200 may directly contact a bumper layer 280 penetrating an intermediate layer 270 to electrically connected to the second protrusion portion 348 of the second semiconductor device 300.

In some embodiments, the first and second semiconductor devices 200 and 300 may be substantially similar to those described with reference to FIGS. 5 and 6, however the present inventive concept may not be limited thereto. That is, each of the first and second semiconductor devices 200 and 300 may be replaced by other semiconductor devices described in FIGS. 1 to 7.

In some embodiments, the stacking structure may include two semiconductor devices 200 and 300, however the present inventive concept may not be limited thereto. For example, the stacking structure may include three to ten or more semiconductor devices.

FIGS. 9 to 14 are cross-sectional views and a graph illustrating methods of manufacturing a semiconductor device in accordance with some embodiments of the present inventive concept. Further, FIG. 9A is an enlarged cross-sectional view illustrating region C of FIG. 9.

Figure 9:
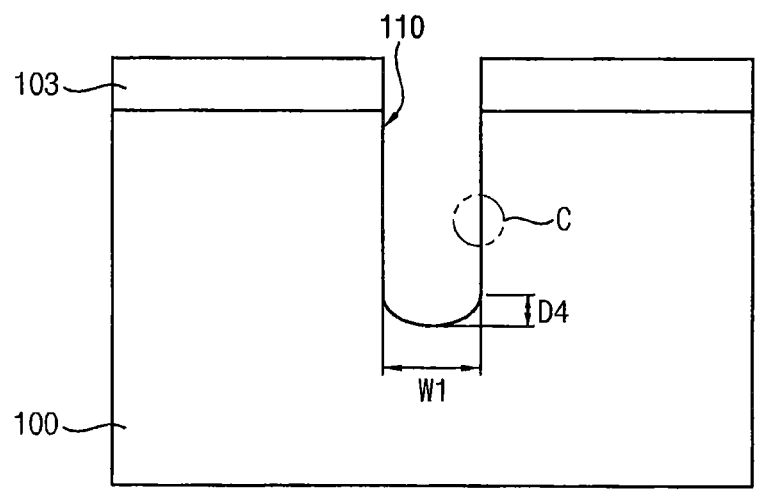
Figure 9A:
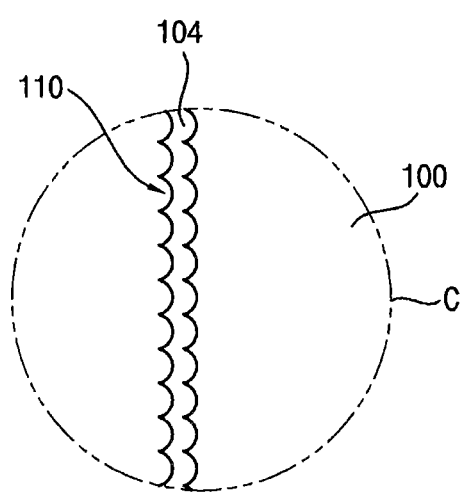

Referring to FIGS. 9 and 9A, a mask layer 103 may be formed on a substrate 100, and the substrate 100 may be partially removed to form a first portion 110 of a via hole 120. In some embodiments, an insulation layer and/or a pad may be formed on the substrate 100 as illustrated in FIGS. 4 and 5, and a mask layer 103 may be formed to cover the insulation layer and/or the pad.

In some embodiments, the first portion 110 of a via hole 120 may be formed by performing a Bosch process. Therefore, the first portion 110 may have a first width W1 which may be substantially constant. Further, a plurality of scallop patterns may be formed on a first sidewall of the first portion 110. For example, a size of single scallop pattern may be about 20 nm.

In the Bosch process, a cycle including an etching step and a step for forming a passivation layer on an inner wall of the via hole may be performed repeatedly. That is, the passivation layer 104 having a uniform thickness may be formed on the first sidewall and a bottom of the first portion 110. Then, an isotropic etching process is performed to partially remove the passivation layer 104 on the bottom surface of the first portion 110, and then to partially remove the substrate 100 exposed by the passivation layer 104. Accordingly, as the cycle is performed repeatedly, a depth of the first portion 110 may increase and a number of the scallop patterns may also increase.

In some embodiments, the first portion 110 may have a bottom surface which may not be substantially flat. That is, a height difference D4 between an uppermost and a lowermost of the bottom surface of the first portion 110 may be greater than a predetermined value. Further, a ratio (D4/W1) between the height difference and the first width may be greater than a predetermined value. For example, when the first width W1 of the first portion 110 is between about 4 μm and about 10 μm, the height difference may be greater than about 1 μm. Further, a ratio (D4/W1) between the height difference and the first width may be greater than about 0.15.

According to some embodiments, an etching process time for forming the first portion 100 and a deposition process time for forming the passivation layer 104 will be described with reference to FIG. 11.

Figure 10:
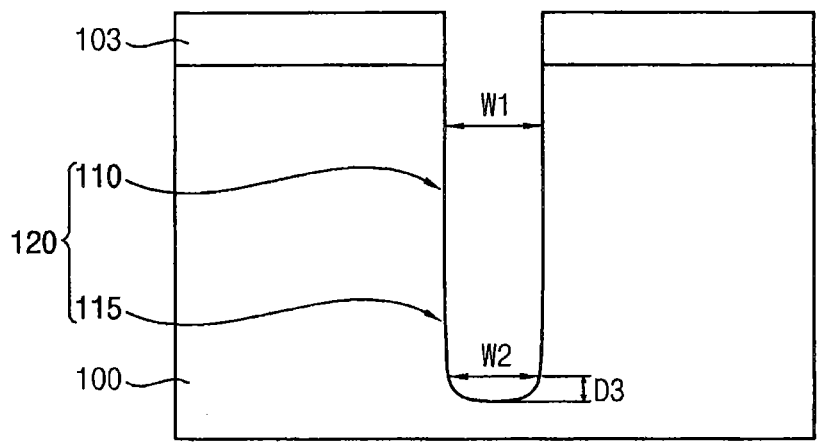
Figure 11:
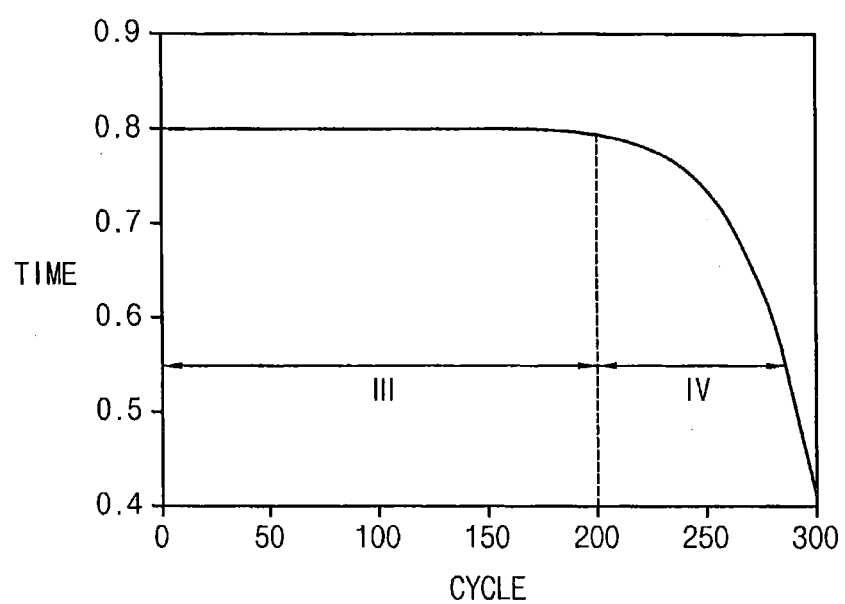

Referring to FIGS. 10 and 11, the substrate 100 may further be partially removed to form a second portion 115 of the via hole 120.

The Bosch process may be further performed to form the second portion 115, which may be in fluid communication with the first portion 110 of the via hole 120. However, a second etching process time for forming the second portion 115 of the via hole 120 may be substantially less than a first etching process time for forming the first portion 110 of the via hole 120. Further, as a depth of the second portion 115 increases, the second etching process time for forming the second portion 115 of the via hole 120 may decrease.

In some embodiments, an etching process time of a first cycle of the Bosch process for forming the first portion 110 may be twice greater than an etching process time of a last cycle of the Bosch process for forming the second portion 115.

In some embodiments, an etching process time of each cycle of the Bosch process may be determined by below equations.

$$Y = Y_o + [Y_E - Y_o]x^n \quad (1)$$

$$x = (c_R - 1)/(c_E - 1) \quad (2)$$

In the equation (1), Y represents an etching process time of each cycle of the Bosch process, $Y_O$ represents an etching process time of a first cycle of the Bosch process, $Y_E$ represents an etching process time of a last cycle of the Bosch process. Further, n is a variable parameter that determines the shape of the via hole 120. In the present inventive concept n is between about 5 and about 15. The variable x is determined by the equation (2). In the equation (2), $C_R$ represents a current cycle number, and $C_E$ represents a total cycle number.

In some embodiments, n is determined by the first width W1 of the via hole 120. For example, when the first width W1 of the via hole 120 is about 5 μm, n may be about 10. Further, when the first width W1 of the via hole 120 is greater than 6 μm, n may be between about 5 and about 10. That is, as the first width W1 of the via hole 120 increases, n may decrease.

By performing the Bosch process with the equations (1) and (2), a second sidewall of the second portion 115 may have a taper shape, and a bottom surface of the second portion 115 may be substantially flat. That is, a ratio between the second width W2 of the second portion 115 and the first width W1 of the first portion 110 (W2/W1) may be between about 0.85 and about 0.94. A height difference D3 between an uppermost and a lowermost of the bottom surface of the second portion 115 may be less than about 1 μm. Further, a ratio (D3/W1) between the height difference and the first width may be less than about 0.15.

FIG. 11 is a graph showing an etching process time of each cycle of the Bosch process. X-axis represents a current cycle number ($C_R$), and Y-axis represents an etching process time of each cycle of the Bosch (Y). Further, in FIG. 11, $Y_O$ is about 0.8 second, and YE is about 0.4 second. The variable n is determined as 10, and the total cycle number $C_E$ is 300. In FIG. 11, region (III) represents a process for forming the first portion 110, and region (IV) represents a process for forming the second portion 115.

Figure 12:
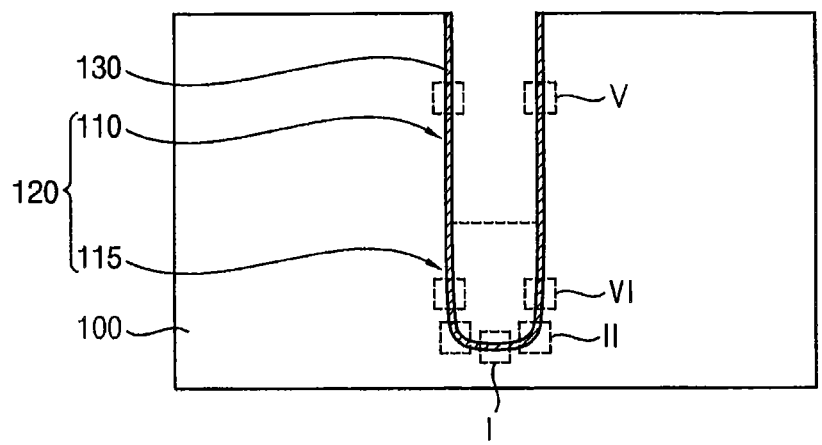

Referring to FIG. 12, a seed pattern 130 may be formed on the sidewall and the bottom surface of the via hole 120.

The seed pattern 130 may be formed using a metal such as aluminum (Al), copper (Cu), Nickel (Ni), Tungsten (W), Titanium (Ti), Tantalum (Ta), gold (Au), etc. by a physical vapor deposition (PVD) process, a chemical vapor deposition (CVD) process and/or an atomic layer deposition (ALD) process.

In some embodiments, as the second sidewall of the second portion 115 of the via hole 120 may have the taper shape, and the bottom surface of the second portion 115 may be substantially flat, the seed pattern 130 may have an improved coverage.

Further, thicknesses of each portions of the seed pattern 130 may be substantially similar to those described with reference to FIG. 13.

Figure 14:
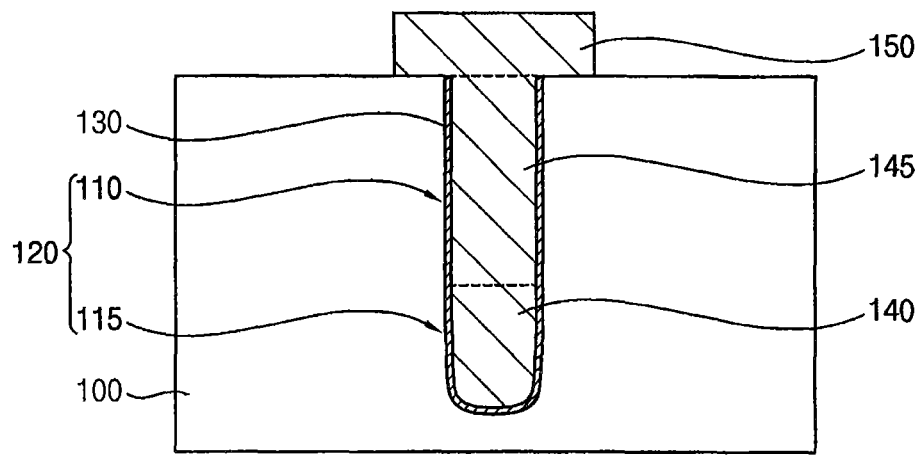

Referring to FIG. 14, a first filling portion 140, a second filling portion 145 and a first protrusion portion 150 may be formed to fill the via hole 120.

In some embodiments, a conductive layer may be formed on the first surface of the substrate 100 to fill the via hole 120, and then the conductive layer may be partially removed to form the first filling portion 140, the second filling portion 145 and the first protrusion portion 150. Further, an insulation layer and/or a pad may be further forming on the first surface of the substrate 100 as illustrated in FIGS. 4 and 5. In some embodiments, the first protrusion portion 150 may be replaced by an insulation layer, a wiring pattern, a contact plug and a pad as illustrated in FIG. 7.

According to some embodiments, the seed pattern 130 may have an improved coverage, so that the through via 163 may formed on the seed pattern 130 without forming a void.

Figure 15:
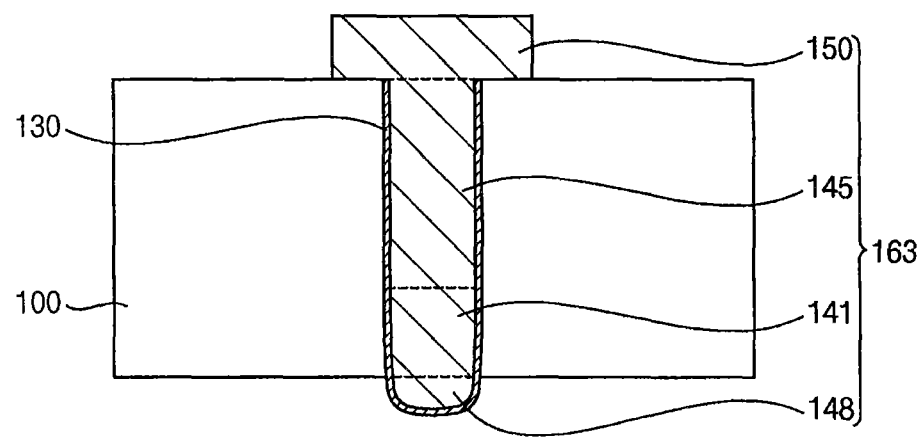

Referring to FIG. 15, the substrate 100 may be partially removed from the second surface of the substrate 100 to expose a second protrusion portion 148.

By partially removing the substrate 100, the second protrusion portion 148 may be exposed from the second surface of the substrate 100. In some embodiments, the substrate 100 may be partially removed by an etch back process and/or a chemical mechanical polarization process.

Then, the substrate 100 may be further removed, so that the second protrusion portion 148 may be projected from the second surface of the substrate 100. For example, the substrate 100 may be removed by an etching process, so that a sidewall of the second protrusion portion 148 may be exposed.

Figure 16:
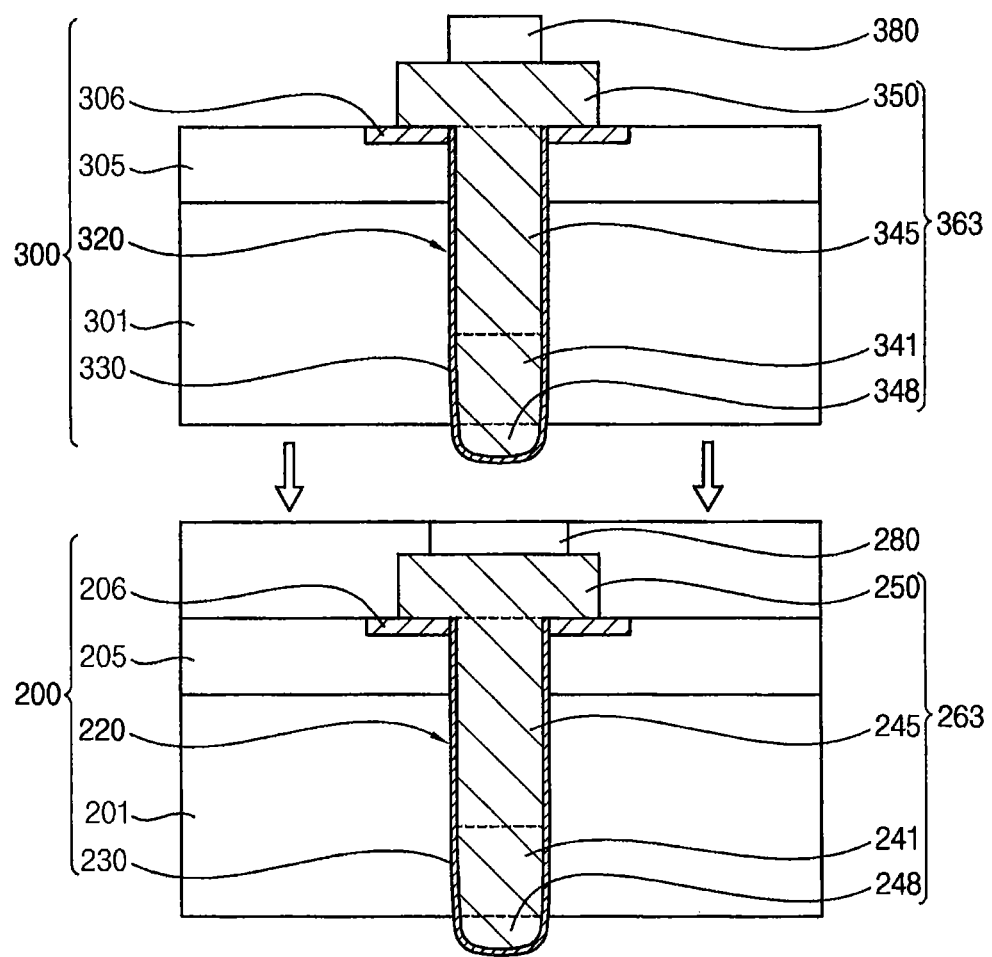

FIG. 16 is a cross-sectional view illustrating methods of manufacturing a stacking structure of a semiconductor device in accordance with some embodiments of the present inventive concept.

Each of the semiconductor devices 200 and 300 may be substantially the same as or similar to those described with reference to FIG. 8. Each of the semiconductor devices 200 and 300 may be manufactured by the methods described with reference to FIGS. 9 to 14.

Then, a first protrusion portion 250 of the first semiconductor device 200 may be aligned with a second protrusion portion 348 of the second semiconductor device 300. Then the first semiconductor device 200 and the second semiconductor device 300 may be stacked sequentially. The first and second semiconductor devices 200 and 300 may transfer the electrical signal through each of substrates 201 and 301. The above semiconductor devices 200 and 300 may include a semiconductor package.

Figure 17:
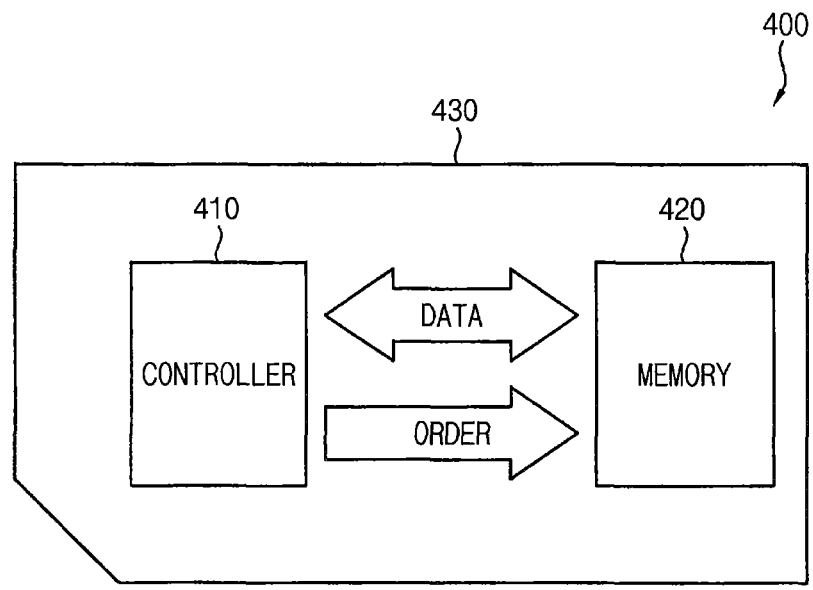

FIG. 17 is a schematic view of a memory card 400 according to some embodiments of the present inventive concept.

Referring to FIG. 17, the memory card 400 may include a controller 410 and a memory 420 formed and/or maintained in a housing 430, or the like. The controller 410 and the memory 420 may exchange an electrical signal. For example, according to a command of the controller 410, the controller 410 may exchange data with the memory 420. Therefore, the memory card 400 may store data in the memory 420 and/or may output data from the memory 420.

For example, the memory 420 may include the semiconductor device described with reference to FIG. 1 to FIG. 16. The memory card 400 may be used as a data storage medium for various portable devices. For example, the memory card 400 may include a multimedia card (MMC) and/or a secure digital card (SD).

Figure 18:
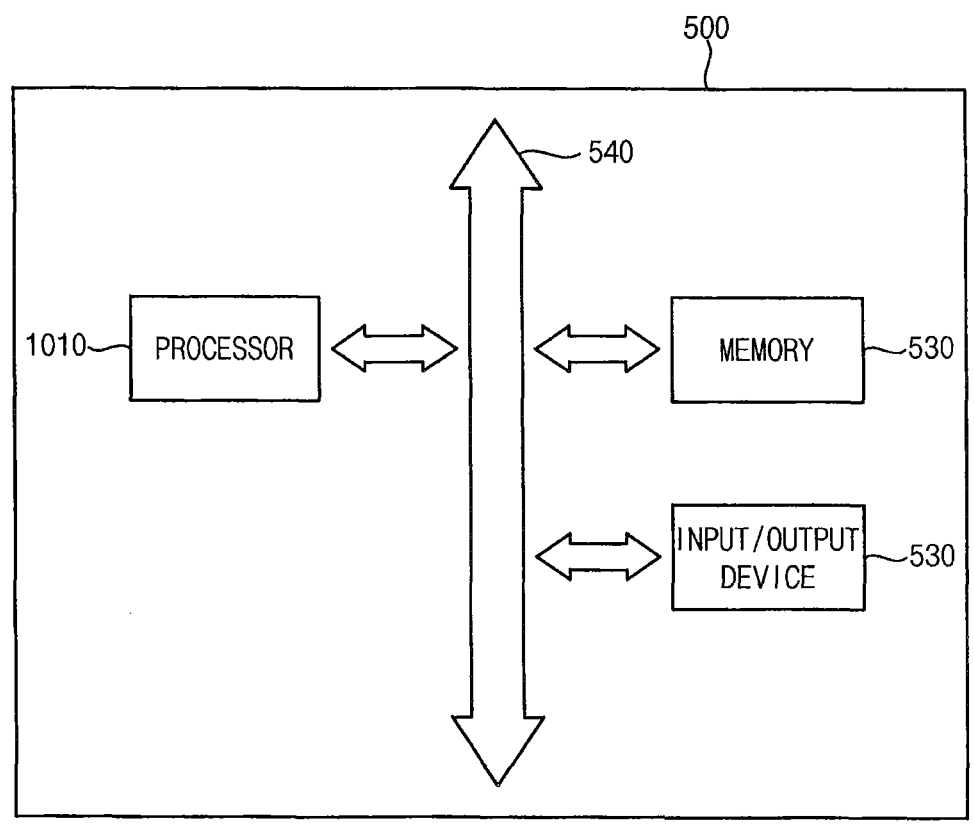

FIG. 18 is a block diagram of an electronic system 500 according to some embodiments of the inventive concept.

Referring to FIG. 18, the electronic system 500 may include a processor 510, a memory chip 520, and an input/output device 530, which can perform data communication by using a bus 540. The processor 510 may execute a program and control the electronic system 500. The input/output device 530 may be used to input or output data of the electronic system 500. The electronic system 500 may be connected with an external device, for example, a personal computer or a network by using the input/output device 530 to exchange data with the external device. For example, the memory 520 may include the non-volatile memory device described with reference to FIG. 1 through FIG. 16.

For example, the electronic system 500 may constitute various electronic controllers needing the memory 520, and may be used, for example, in mobile phones, MP3 players, navigations, solid state disks (SSD), household appliances, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:
   providing a substrate including a first surface and a second surface that is opposed to the first surface;
   forming a via hole that penetrates the substrate from the first surface toward the second surface, the via hole including a first portion and a second portion, wherein the first portion includes a first sidewall that is substantially perpendicular to the first surface, wherein the second portion includes a second sidewall that decreases from the first surface toward the second surface and a bottom surface that is substantially flat;

forming a seed pattern on the first sidewall of the first portion, the second sidewall of the second portion and the bottom surface of the second portion of the via hole, wherein a first thickness (Vt) of the seed pattern on the first sidewall of the first portion is less than a second thickness (VIt) of the seed pattern on the second sidewall of the second portion; and forming a through via that fills the via hole, wherein the bottom surface of the second portion of the via hole includes a peripheral portion adjacent the second sidewall of the second portion and a central portion surrounded by the peripheral portion, and wherein the central portion is more flat than the peripheral portion.

2. The method of manufacturing a semiconductor device of claim 1, wherein the first portion of the via hole includes a first width (W1), the second portion of the via hole includes a second width (W2), and a ratio between the second width and the first width (W2/W1) is between about 0.85 and about 0.94.

3. The method of manufacturing a semiconductor device of claim 2, wherein a height difference between an uppermost and a lowermost of the bottom surface of the via hole is a first distance (D3), and a ratio between the first distance and the first width (D3/W1) is between about 0 and about 0.15.

4. The method of manufacturing a semiconductor device of claim 1, wherein forming the via hole includes performing a Bosch process in which a cycle including an etching operation and an operation for forming a passivation layer on an inner wall of the via hole is performed repeatedly.

5. The method of manufacturing a semiconductor device of claim 4, wherein a first etching process time for forming the first portion of the via hole is greater than a second etching process time for forming the second portion of the via hole.

6. The method of manufacturing a semiconductor device of claim 5, wherein etching process time of each cycle of the Bosch process is determined by equations (1) and (2), wherein equation (1) includes $$Y=Y_o+[Y_E-Y_o]x^n \qquad (1),$$

wherein equation (2) includes $$x=(c_R-1)/(c_E-1) \qquad (2),$$

and wherein Y represents etching process time of each cycle of the Bosch process, $Y_o$ represents etching process time of a first cycle of the Bosch process, $Y_E$ represents etching process time of a last cycle of the Bosch process, $C_R$ represents a current cycle number, $C_E$ represents a total cycle number and n is a variable parameter.

7. The method of manufacturing a semiconductor device of claim 6, wherein n of the equation (1) decreases, as a width of the via hole increases.

8. The method of manufacturing a semiconductor device of claim 1, wherein a ratio between the second thickness and the first thickness (VIt/Vt) is between about 1.2 and about 2.

9. The method of manufacturing a semiconductor device of claim 1, wherein a third thickness (It) of the seed pattern on the central portion of the bottom surface of the second portion is greater than a fourth thickness (IIt) of the seed pattern on the peripheral portion of the bottom surface of the second portion.

10. The method of manufacturing a semiconductor device of claim 1, wherein the fourth thickness (IIt) of the seed pattern on the peripheral portion of the bottom surface of the second portion is less than the second thickness (VIt) of the seed pattern on the second sidewall of the second portion.

11. The method of manufacturing a semiconductor device of claim 1, wherein the through via includes a first protrusion portion and a second protrusion portion, the first protrusion portion is exposed to the first surface of the substrate, and the second protrusion portion is exposed to the second surface of the substrate.

12. The method of manufacturing a semiconductor device of claim 11, wherein the second protrusion portion is formed by partially removing the substrate from the second surface of the substrate.

13. The method of manufacturing a semiconductor device of claim 1, wherein the sidewall of the first portion of the via hole includes a scallop shape.

14. A method of manufacturing a semiconductor device, comprising:

providing a substrate having a first surface and a second surface that is opposed to the first surface;

forming a via hole by a Bosch process in which a cycle including an etching operation and a operation for forming a passivation layer on an inner wall of the via hole is performed repeatedly, the via hole penetrating the substrate from the first surface toward the second surface, and including a first portion and a second portion, wherein the first portion has a first sidewall that is substantially vertical to the first surface, wherein the second portion includes a second sidewall that decreases in thickness toward the second surface, and includes a bottom surface that is substantially flat, wherein the first portion of the via hole includes a first width (W 1), the second portion of the via hole includes a second width (W2), and a ratio between the second width and the first width (W2/W1) is between about 0.85 and about 0.94;

forming a seed pattern on the first sidewall of the first portion, the second sidewall of the second portion and the bottom surface of the second portion of the via hole, wherein a first thickness (Vt) of the seed pattern on the first sidewall of the first portion of the via hole is less than a second thickness (VIt) of the seed pattern on the second sidewall of the second portion of the via hole; and forming a through via that fills the via hole, wherein the bottom surface of the second portion of the via hole includes a peripheral portion adjacent the second sidewall of the second portion and a central portion surrounded by the peripheral portion, and wherein the central portion is more flat than the peripheral portion.

15. A method of manufacturing a semiconductor device, comprising:

providing a substrate including a first surface and a second surface that is opposed to the first surface;

forming a via hole by a Bosch process in which a cycle including an etching operation and a operation for forming a passivation layer on an inner wall of the via hole is performed repeatedly, the via hole penetrating the substrate from the first surface toward the second surface, the via hole including a first portion and a second portion, wherein the first portion includes a first sidewall that is substantially perpendicular to the first surface, wherein the second portion includes a second sidewall that defines a taper of the via hole and includes an angle relative to the first sidewall that is less than or equal to about 10 degrees, and a bottom surface that is substantially flat;

forming a seed pattern on the first sidewall of the first portion, the second sidewall of the second portion and the bottom surface of the second portion of the via hole, wherein a first thickness (Vt) of the seed pattern on the first sidewall of the first portion is less than a second thickness (VIt) of the seed pattern on the second sidewall of the second portion; and forming a through via that fills the via hole, wherein the bottom surface of the second portion of the via hole includes a peripheral portion adjacent the second sidewall of the second portion and a central portion surrounded by the peripheral portion, wherein the central portion is more flat than the peripheral portion, wherein a third thickness (It) of the seed pattern on the central portion of the bottom surface of the second portion is greater than a fourth thickness (IIt) of the seed pattern on the peripheral portion of the bottom surface of the second portion, and wherein the fourth thickness (IIt) of the seed pattern on the peripheral portion of the bottom surface of the second portion is less than the second thickness (VIt) of the seed pattern on the second sidewall of the second portion.

16. The method of manufacturing a semiconductor device of claim 15, wherein the first portion of the via hole includes a first width (W1), the second portion of the via hole includes a second width (W2), and a ratio between the second width and the first width (W2/W1) is between about 0.85 and about 0.94.

17. The method of manufacturing a semiconductor device of claim 15, wherein a first etching process time for forming the first portion of the via hole is substantially greater than a second etching process time for forming the second portion of the via hole, wherein etching process time of each cycle of the Bosch process is determined by equations (1) and (2), wherein equation (1) includes $$Y = Y_o + [Y_E - Y_o] x^n \qquad (1),$$

wherein equation (2) includes $$x = (c_R - 1)/(c_E - 1) \qquad (2), \text{ and}$$

wherein Y represents etching process time of each cycle of the Bosch process, $Y_o$ represents etching process time of a first cycle of the Bosch process, $Y_E$ represents etching process time of a last cycle of the Bosch process, $C_R$ represents a current cycle number, $C_E$ represents a total cycle number and n is a variable parameter.

18. The method of manufacturing a semiconductor device of claim 17, wherein n of the equation (1) decreases, as a width of the via hole increases.

* * * * *